(12) United States Patent
Magrath

(10) Patent No.: US 12,712,566 B1
(45) Date of Patent: Aug. 18, 2026

(54) SIGMA-DELTA MODULATOR AND A CLASS D AMPLIFIER

(71) Applicant: Renesas Design Netherlands B.V., 's-Hertogenbosch (NL)

(72) Inventor: Anthony Magrath, Edinburgh (GB)

(73) Assignee: Renesas Design Netherlands B.V., 's-Hertogenbosch (NL)

( * ) Notice: Subject to any disclaimer, the term of this patent is extended or adjusted under 35 U.S.C. 154(b) by 316 days.

(21) Appl. No.: 18/397,361

(22) Filed: Dec. 27, 2023

(51) Int. Cl.
*H03M 3/00* (2006.01)
*H04R 3/02* (2006.01)

(52) U.S. Cl.
CPC .......... *H03M 3/354* (2013.01); *H03M 3/422* (2013.01); *H03M 3/436* (2013.01); *H04R 3/02* (2013.01); *H04R 2420/07* (2013.01)

(58) Field of Classification Search
CPC ...... H03M 3/354; H03M 3/422; H03M 3/436; H04R 3/02; H04R 2420/07
See application file for complete search history.

(56) References Cited

U.S. PATENT DOCUMENTS 6,362,763 B1 * 3/2002 Wang .................... H03M 3/364 327/345
6,724,332 B1 * 4/2004 Melanson ............ H03M 7/3011 341/143
6,956,513 B1 * 10/2005 Wang .................... H03M 3/358 341/143
7,183,957 B1 * 2/2007 Melanson ............... H03F 3/217 341/143
2004/0032355 A1 * 2/2004 Melanson ............. H03M 3/338 341/143
2007/0018866 A1 * 1/2007 Melanson ........... H03M 7/3035 341/143
2007/0152858 A1 * 7/2007 Melanson ............. H03M 3/506 341/143
2008/0068241 A1 * 3/2008 Hong .................... H03M 3/362 341/143
2008/0074303 A1 * 3/2008 Rueger ................... H03M 3/39 341/143
2008/0272946 A1 * 11/2008 Melanson ........... H02M 1/4225 341/172
2014/0240153 A1 * 8/2014 Das ....................... H03M 3/362 341/143
2015/0171887 A1 * 6/2015 Okuda .................. H03M 3/372 341/143
2016/0171966 A1 * 6/2016 Molinari .......... G10K 11/17827 381/71.11
2017/0201270 A1 * 7/2017 Nittala .................. H03M 3/486
2018/0254757 A1 * 9/2018 Zhang ................... H03F 3/2175
2024/0033302 A1 * 2/2024 Mesa Pardillo ........ A61P 35/00

OTHER PUBLICATIONS

Pavan et al, "Understanding Delta-Sigma Data Converters Second Edition", IEEE Press and Wiley-Intercedence, 2013. 583 pages.

* cited by examiner

*Primary Examiner* — Carolyn R Edwards
*Assistant Examiner* — Kuassi A Ganmavo
(74) *Attorney, Agent, or Firm* — SCULLY, SCOTT, MURPHY & PRESSER, P.C.

(57) ABSTRACT

A sigma-delta modulator having a sigma-delta block providing a non-limiting output and having a stabilizer receiving the output of the sigma-delta block and transmitting a stabilised loop signal wherein the sigma-delta block and stabilizer are arranged as a sigma-delta loop. The sigma-delta block receives the stabilized loop signal from the stabilizer, thereby stabilizing the sigma-delta block.

17 Claims, 5 Drawing Sheets

100
120
101
102a
104a
106
130
108a
Loop filter
Q 110
120
102c
104c
102b
104b
102a
104a
106
101
108a
112
108b
114
130
108c
116
Loop filter 1
Loop filter 2
Loop filter 3
Pulse-width Modulator
Class D Output Stage
ADC sigma-delta block
Stabilizer 200
101
204
202
210a
Loop filter H(z)
Q
saturator
Stabiliser
S1
S2
S3

201
220
102a
101
104a
106
204
202
206
230
208a
207
212a
210a

SIGMA-DELTA MODULATOR AND A CLASS D AMPLIFIER

TECHNICAL FIELD

The present disclosure relates to a sigma-delta modulator and a class D amplifier.

BACKGROUND

Sigma-delta modulators (SDM) are used in oversampled digital-to-analog (D-A) and analog-to-digital (A-D) converters to reduce the number of bits used in the conversion processes, to reduce circuit complexity and to speed up and take advantage of higher linearity of low-bit converters. SDMs are also used in digital class D amplifiers to reduce the clock rate used to time to pulse edges of the output switching stage. SDMs are also used in many other digital oversampled applications where there is the requirement to reduce the digital word length for complexity reasons, without sacrificing performance.

SUMMARY

It is desirable to provide an improved sigma-delta modulator.

According to a first aspect of the disclosure there is provided a sigma-delta modulator, comprising a sigma-delta block configured to provide a non-limiting output, and a stabilizer configured to receive the output of the sigma-delta block, and transmit a stabilized loop signal, wherein the sigma-delta block and stabilizer are arranged as a sigma-delta loop, and the sigma-delta block is configured to receive the stabilized loop signal from the stabilizer, thereby stabilizing the sigma-delta block.

Optionally, the sigma-delta block comprising a quantizer arranged to provide the non-limiting output.

Optionally, the sigma-delta block comprising a first loop filter arranged to filter a predetermined range and provide a filtered sigma-delta signal to the non-limiting quantizer.

Optionally, the stabilizer comprising a saturator arranged to restrict the output of the sigma-delta block to a predetermined limit.

Optionally, the stabilizer comprising a subtractor configured to extract an overload signal that is determined by the difference in magnitude between the output signal of the sigma-delta block over the predetermined limit.

Optionally, when output signal falls below the predetermined limit, the overload signal is zero.

Optionally, the stabilizer comprising a first overload adder configured to add the overload signal from the subtractor back to the stabilized loop signal to form a combined feedback signal.

Optionally, the predetermined limit comprising approximately −3 dB.

Optionally, the sigma-delta modulator has an external input signal, the sigma-delta block comprising a first sigma-delta adder configured to add the combined feedback signal to an external input of the sigma-delta modulator thereby providing a combined input signal for the sigma-delta block.

Optionally, the sigma-delta modulator comprises a plurality of nested feedback loops, wherein each nested feedback loop is configured to receive the overload signal, wherein the overload signal is added into all feedback signals thereby ensuring stability in all loops.

Optionally, the plurality of nested feedback loops comprises a first nested feedback loop comprising: a first overload adder and; a first sigma-delta adder.

Optionally, the plurality of nested feedback loops comprises a second nested feedback loop comprising: a second overload adder and; a second sigma-delta adder.

Optionally, the plurality of nested feedback loops comprises a third nested feedback loop comprising: a third overload adder and; a third sigma-delta adder.

Optionally, the first feedback loop is arranged as the innermost of the plurality of nested feedback loops.

According to a second aspect of the disclosure there is provided a class D amplifier comprising a sigma-delta modulator, comprising a sigma-delta block arranged to provide a non-limiting output, a stabilizer arranged to receive the output of the sigma-delta block and transmit a stabilised loop signal, wherein the sigma-delta block and stabilizer are arranged as a sigma-delta loop wherein the sigma-delta block receives the stabilized loop signal from the stabilizer, thereby stabilizing the sigma-delta block.

Optionally, the class D amplifier comprises a saturator that limits the class D amplifier to a predetermined maximum modulation index, thereby preventing overload within the class D amplifier.

Optionally, the class D amplifier is for audio.

Optionally, the class D amplifier for use in wireless headphone applications.

It will be appreciated that the class D amplifier of the second aspect may include features set out in the first aspect and can incorporate other features as described herein.

According to a third aspect of the disclosure there is provided a method of stabilizing a sigma-delta modulator comprising providing a non-limiting output using a sigma-delta block, receiving the non-limiting output at a stabilizer, transmitting a stabilized loop signal from the stabilizer, receiving the stabilized loop signal at the sigma-delta block, and using the stabilized loop signal to stabilize the sigma-delta block, thereby stabilizing the sigma-delta modulator.

Optionally, the sigma-delta modulator is part of a class D amplifier.

It will be appreciated that the method of the third aspect may include providing and/or using features set out in the first and/or second aspects, and can incorporate other features as described herein.

BRIEF DESCRIPTION OF THE DRAWINGS

The disclosure is described in further detail below by way of example and with reference to the accompanying drawings, in which.

DETAILED DESCRIPTION

Figures 1A, 1B:
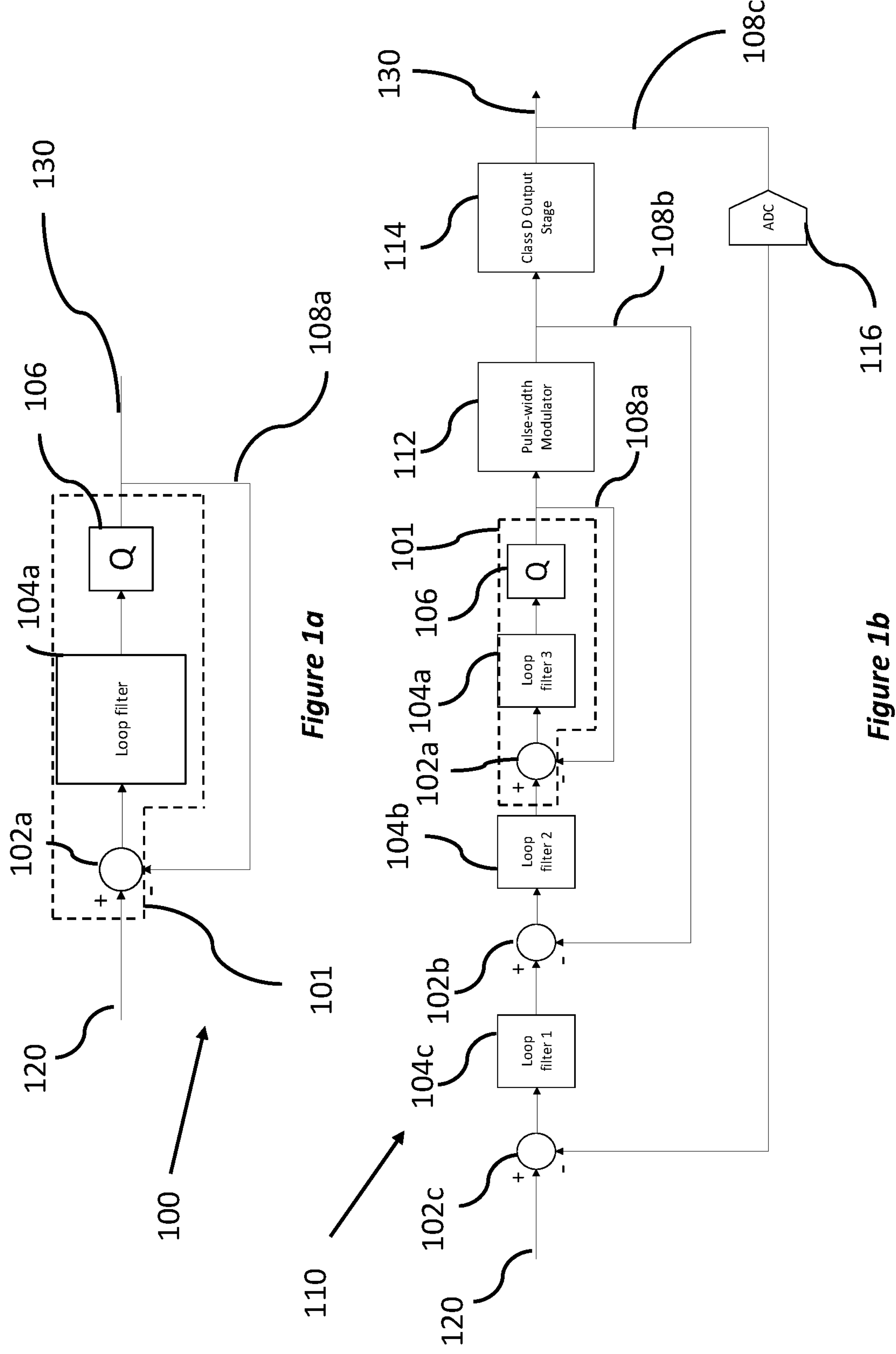
FIG. 1*a* is a schematic of a known sigma-delta modulator.
FIG. 1*b* is a schematic of a known Class D amplifier.

FIG. 1*a* illustrates a known architecture of a sigma-delta modulator 100 (SDM).

The SDM 100 in this example has a sigma-delta block 101 (SDB) that has a sigma-delta adder 102*a* and a quantizer 106. The SDB 101 receives an input signal 120, which in this example may be a digital signal. The adder 102*a* provides an input to the loop filter 104*a*. A loop filter 104*a* is a component in control systems and signal processing, designed to shape or filter the output of a feedback loop, where output of the feedback loop may be a feedback loop error signal.

The loop filter 104*a* refines the response by adjusting the characteristics of the feedback loop error signal, enhancing stability, reducing noise, and optimizing performance. In sigma-delta modulators or closed-loop amplifiers, the loop filter helps mitigate distortion and regulate the system's behaviour by manipulating the feedback signal.

The loop filter 104*a* provides a signal to the quantizer 106 which in turn outputs an output signal 130 of the SDM 100.

A quantizer 106 is a fundamental component in digital signal processing that discretizes continuous amplitude input signals into a finite set of discrete output levels. Operating like a digital approximation device, it assigns a specific digital code or value to represent the amplitude of an incoming analog or continuous signal. This process introduces quantization error, which is the difference between the actual analog value and its digital representation. Quantizers are utilized in various audio applications, including analog-to-digital converters, compression, and audio processing, where precise representation of continuous signals is necessary for accurate digital processing and storage.

The SDM 100 has a closed loop signal provided via a closed loop 108*a* that is received by the SDB 101, specifically the sigma-delta adder 102*a*. The SDM 100 uses negative feedback to the quantizer 106 to shape the quantization noise, such that noise is attenuated in the band of interest at the expense of increased noise out of band. In audio applications, the band of interest is typically in the range 0-20 kHz.

A conventional SDM 100 would become unstable when the amplitude of the input signal 120 cannot be represented by the output 130 (due to overload or limiting). The output can no longer respond to the action of the feedback loop, resulting in large internal signal levels which do not recover even when the signal level is reduced.

There are three known methods commonly used to ensure stability in known SDMs.

- Method 1: Limit the input signal range so that the unstable region is never entered.
- Method 2: Reset the internal state of the modulator when instability is detected.
- Method 3: Limit the internal integrators of the loop filter to prevent instability.

Method 1 is not reliable as it is difficult to exactly predict the stability limit for a wide range of signals and leads to sacrifices in dynamic range to guarantee stability.

Method 2 has the disadvantage that the performance degradation is extreme due to the loss of integrator state, wherein the integrator state refers to the accumulative output or accumulated value, such as an accumulated error, of an integrator circuit over time.

Method 3 (the most common method) is less damaging in terms of performance, but it is also the least reliable. Some applications such as Class D may have multiple nested feedback loops, FIG. 1*b* illustrates the known typical architecture of a Class D amplifier 110 having nested loops 108*a*, 108*b*, 108*c*.

The Class D amplifier 110 has a pulse width modulator (PWM) 112. A PWM is an electronic device or circuit that generates pulse-width modulated signals.

In this example, the class D amplifier 110 receives the input signal 120, which may be a digital signal.

The PWM 112 may vary the width of pulses in a square wave, where the duty cycle, or the ratio of pulse duration to the total period, is adjusted. The PWM 112 is a component in various applications, including switching power supplies, audio amplifiers, and digital-to-analog converters, providing a versatile method for signal modulation and control. In this example, the PWM 112 converts the output of the quantizer 106 to a set of amplitudes to a corresponding set of widths.

The class D amplifier 110 has an analog-to-digital converter 116 (ADC) that provides the functionality of converting continuous analog audio signals into discrete digital representations. These converters may be used in closed-loop Class D amplifier architectures, where the digital feedback loop corrects errors in the output stage. The ADC digitizes the analog output, facilitating comparison with the desired input for error correction. By converting the analog signal into a digital format, ADCs enable precise monitoring and adjustment of the amplifier's performance, enhancing accuracy and minimizing distortion, ultimately contributing to the amplifier's ability to faithfully reproduce high-fidelity audio signals in an efficient and controlled manner.

The class D amplifier 110 has the innermost first loop 108*a* including the quantizer 106 as previously discussed in SDB 101.

The class D amplifier 110 has a second loop 108*b* around the PWM 112 coupled to a second sigma-delta adder 102*b* and a second loop filter 104*b*.

The class D amplifier 110 has a third loop 108*c* around the class D the output stage 114, having an ADC 116 coupled to a third adder 102*c*, which is coupled to a third loop filter 104*c*.

In the case of the known class D amplifier 110 it can be very complex and nonlinear, making it extremely difficult to stabilize by integrator limiting due to the complex interactions between the loops. Even if the innermost loop 108*a* is made stable, the PWM 112 and/or output stage loops will still need be independently stabilized, which is difficult to achieve because the dynamics of the outer loops 108*b*, 108*c* are affected by the dynamics of the inner loop 108*a*.

Figures 2A, 2B:
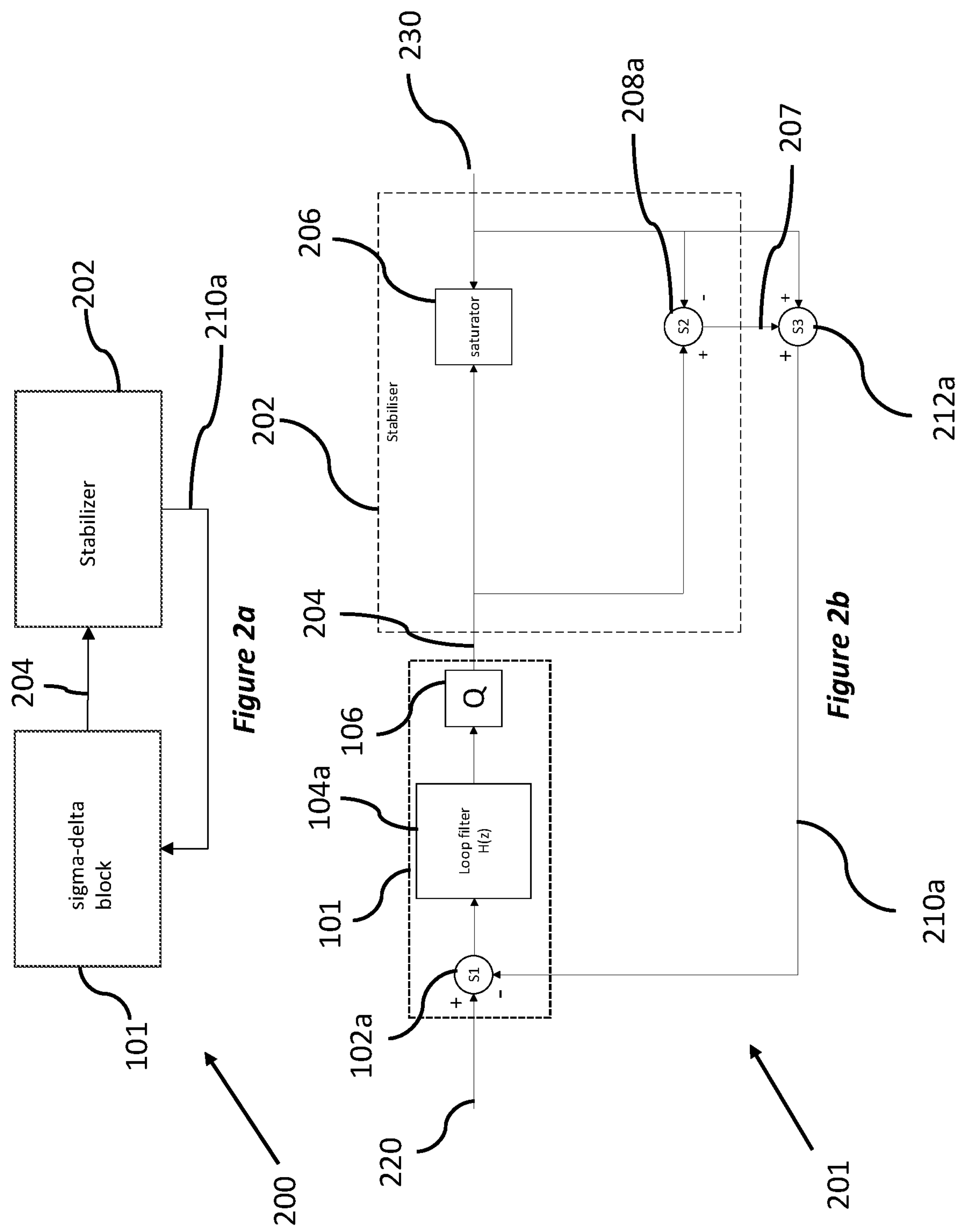
FIG. 2*a* is a schematic of a sigma-delta modulator having a stabilizer in accordance with a first embodiment of the present disclosure.
FIG. 2*b* is a schematic a sigma-delta modulator having a stabilizer comprising a saturator in accordance with a second embodiment of the present disclosure.

FIG. 2*a* illustrates a SDM 200 having a SDB 101 and stabilizer 202 in accordance with a first embodiment of the present disclosure.

The SDM 200 comprises a SDB 101. The SDB 101 provides a SDB output signal 204, which may be non-limiting, to the stabilizer 202. Non-limiting may refer to the output of a quantization process that does not impose restrictions on the range of the quantized values.

For example, limited quantizers may limit the output within a predefined range. The quantizer 106 may be non-limiting and allow the quantized signal to span a wider or unrestricted amplitude range. This type of quantization is often employed in applications where preserving the full dynamic range of the input signal is essential, preventing clipping or distortion. Non-limiting quantizers are particularly beneficial in scenarios requiring high precision and fidelity, enabling accurate representation of input signals without the imposition of amplitude restrictions.

The SDM has a stabilizer 202 that is configured to receive the non-limiting output signal 204, generate a stabilizing signal based on the non-limiting output signal 204, and use the stabilizing signal to stabilize the SDB 101, thereby stabilizing the SDM 200. The stabilizer 202 receives the output signal 204 of the SDB 101 and may transmit a stabilized loop signal, through the closed loop 210*a*. It will be appreciated that the stabilizing signal may be referred to as a stabilized loop signal.

FIG. 2*b* illustrates a SDM 201 having the SDB 101 and a stabilizer 202 coupled to a first overload adder (SDA) 212*a* in accordance with a second embodiment of the present disclosure.

To prevent instability in the SDM 201, the feedback signal needs to act as if the output did not limit.

The stabilizer 202 comprises a saturating limiter, which may be referred to as a saturator 206 that receives the nonlimiting output signal from quantizer 106 of the SDB 101 which restricts the output of the SDB 101 to a predetermined range.

For example, the saturator 206 is a signal processing component that constrains the amplitude of its receiving signal 204, preventing it from exceeding a specified range. The saturator 206 may act as a non-linear element, forcefully limiting the SDB output signal 204 magnitude when the signal 204 surpasses a predetermined limit or threshold. This saturation effect produces a clipped or compressed output, reducing the dynamic range of the signal 204, thereby providing SDM output signal 230.

The stabilizer 202 has a subtractor 208*a* that subtracts signals above the linear range of the predetermined limit (when the saturator 206 is saturating). The subtractor 208*a* extracts an overload signal that is determined by the difference in magnitude between the output signal of the SDB 101 over the predetermined limit. The overload signal in this context is the difference between the SDM output 230 and a predetermined limit (=saturator output). The saturator 206 may be responsible for implementing the predetermined limit.

For signal 204 within the predetermined linear range (within +/−T, wherein T refers to an amplitude, and +/−T refers to an amplitude range), the error is zero and the output of the subtractor 208 is zero as well, therefore the stabilizer acts transparent in operation. For signal 204 above the linear range (when the saturator is saturating), the output of subtractor 208*a* provides the overload signal 207.

In this example, the maximum input signal is typically +/−1 and the SDB is usually stable for an input range up to +/−0.3 to +/−0.9. An example stabiliser threshold is T=0.707 (−3 dB). The unsaturated output 204 and internal filter states of the loop filter H(z) may also require additional headroom bits to ensure that the stabiliser limits before the SDB limits. Typically, 3 headroom bits may be used.

The overload signal 207 is not discarded, instead, it is added back into a feedback loop 210*a*. The SDM 201 has an adder 212*a*, which may be referred to as an overload adder 212*a* within a closed loop 210*a*. The overload adder 212*a* receives both the saturated signal from the saturator 206 and the overload signal from subtractor 208*a* adds the overload signal 207 to the saturated signal, thereby providing a combined feedback loop signal, which may be referred to as a stabilized loop signal through the closed feedback loop 210*a*. The feedback loop 210*a* now acts as if the output signal responded to the input signal even during the overload range.

The stabilizer 202 transmits an SDM output signal 230 to components downstream of the SDM 201.

The SDM 201 has a SDB 101 that has been previously discussed in relation to known circuits. The SDB 101 has an SDA 102*a*, a loop filter 104*a* and a non-limiting quantiser 106. The first loop filter 104*a* is arranged to filter a predetermined range and provide a filtered sigma-delta signal to the non-limiting quantizer 106.

Figure 3:
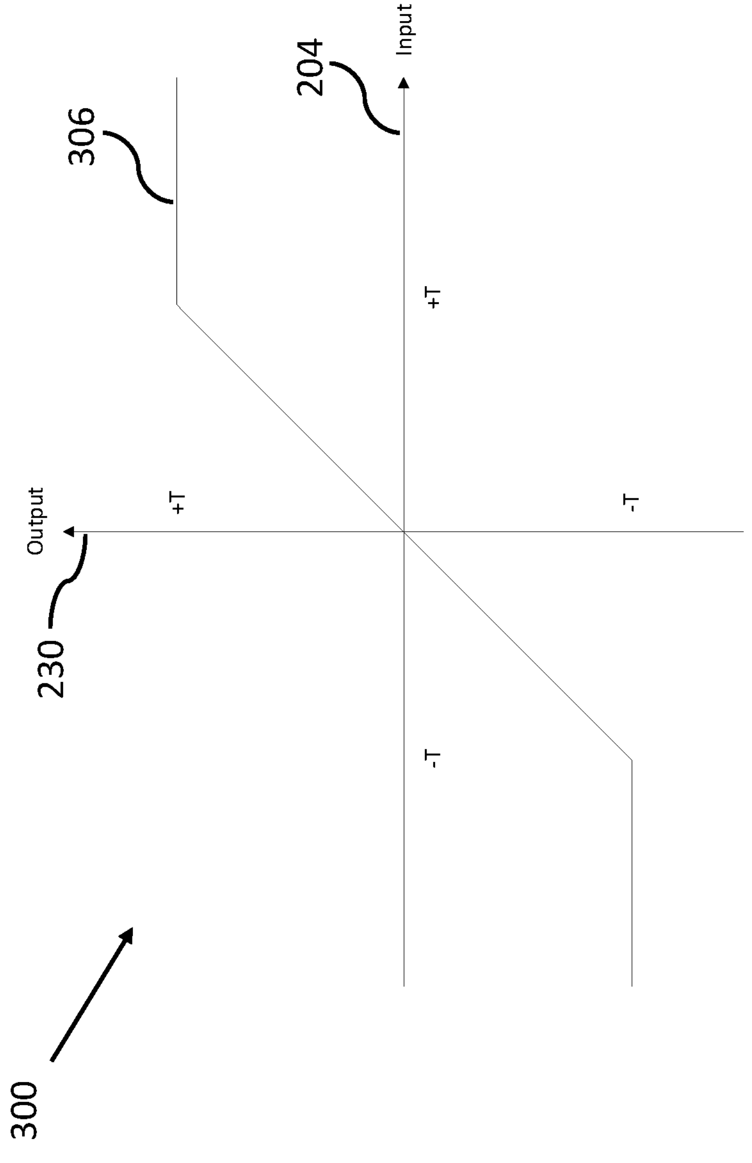
FIG. 3 is a graph of example saturation characteristics of a practical implementation of the system as presented in FIG. 2*b* in accordance with the second embodiment.

The SDM 201 of the present disclosure advantageously does not need to be designed as conservatively as known systems, which can result in improvements in dynamic range. FIG. 3 illustrates a typical saturation characteristic graph 300 of the saturator 206.

The saturation graph displays the input signal 204 from the SDB 101 to the saturator 206. The input signal 204 is non-limiting and may exceed the amplitude of +T and −T. The output signal 230 has been saturated within the predetermined limit of +T to −T, thereby capping the amplitude of the output signal 230.

Noise shaping across the saturator 206 may induce the degradation in signal to noise ratio when the limiting of the output signal 230 occurs.

Figures 4A, 4B:
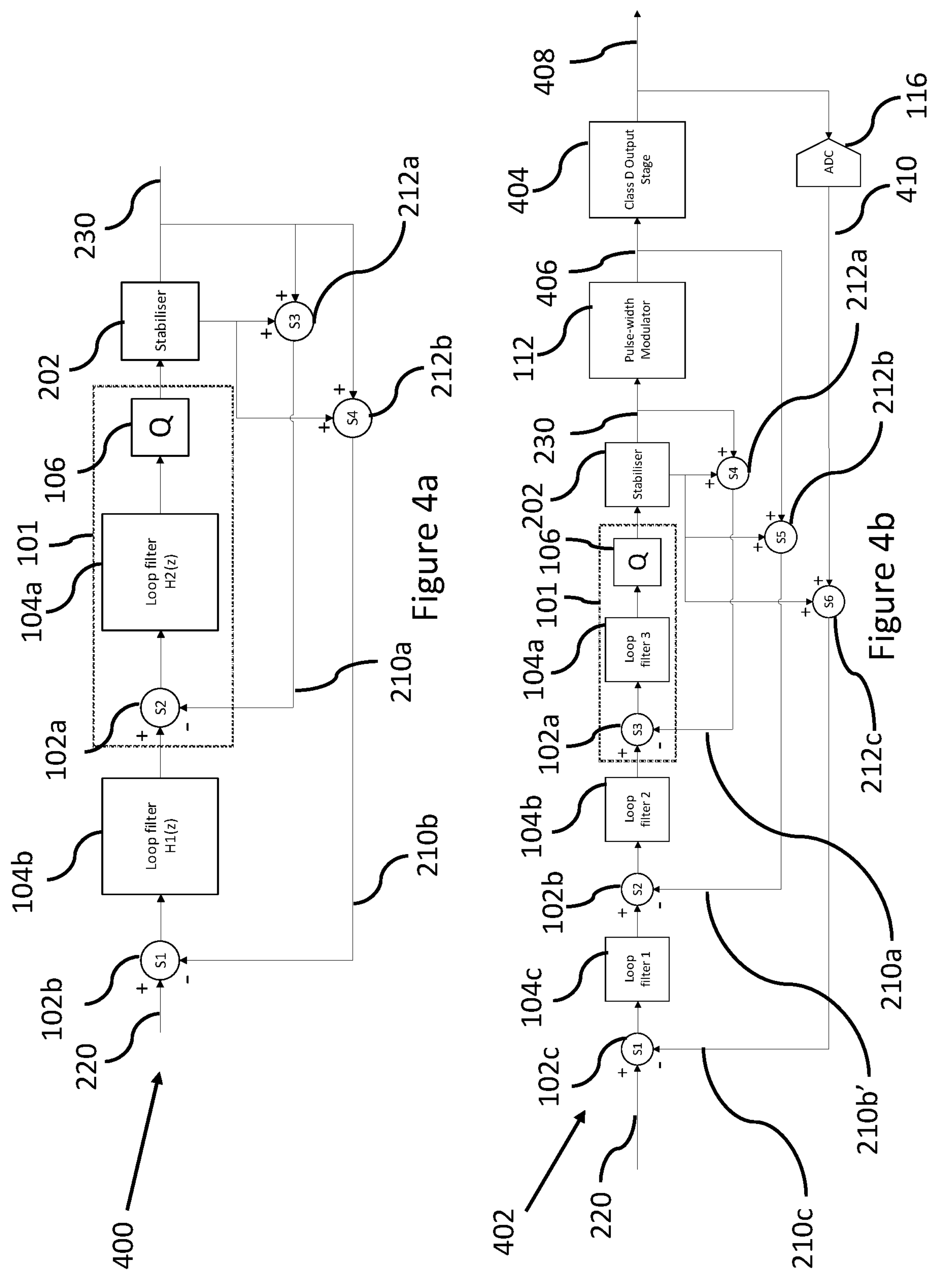
FIG. 4*a* is a schematic of a sigma-delta modulator having a stabilizer with a plurality of nested loops in accordance with a third embodiment of the present disclosure.
FIG. 4*b* is a schematic of a sigma-delta modulator having a stabilizer with a plurality of nested loops in accordance with a fourth embodiment of the present disclosure.

FIG. 4*a* illustrates a SDM 400 having a SDB 101 and a stabilizer 202 coupled to a first adder 212*a* and a second adder 212*b* in accordance with a third embodiment of the present disclosure. in the following discussion relates to specific cases where the output of a SDM needs to be limited within the feedback loop. To ensure that all loops respond if the feedback signal was not limited, the overload signal needs to be added to all the feedback signals in all nested feedback loops. To ensure this solution works, there is only required a single saturator 206 in the stabilizer 202.

The SDM 400 comprises a plurality of nested feedback loops. In this example, the plurality of nested feedback loops comprise a first feedback loop 210*a* and second feedback loop 210*b*. Nested feedback loops refer to a hierarchical arrangement of a plurality of interconnected feedback systems within a larger control or signal processing framework which in this case is the SDM 400.

The output of an outermost loop 210*b* becomes part of the input for the inner loop 210*a*, creating a layered arrangement of a plurality of interconnected feedback systems.

The first and innermost loop 210*a* has been discussed previously.

The second loop 210*b* is formed by coupling a second overload adder 212*b* to receive overload signal 207 from the stabilizer 202, wherein the overload adder 212*b* also receives an output signal 230. The second overload adder 212*b* thereby transmits a second combined closed loop signal 210*b* to a second SDA 102*a* coupled to a loop filter 104*b*, coupled to the SDB 101, coupled to the stabilizer 202, thereby closing the loop.

FIG. 4*b* illustrates a class D amplifier 402 having a plurality of nested feedback loops in accordance with a fourth embodiment of the present disclosure.

The class D amplifier 402 comprises a pulse-width modulator 112 and an ADC 116 as discussed previously.

The class D amplifier 402 has an output stage 404 which is a circuit component that efficiently converts digital signals into amplified analog waveforms to drive speakers. For example, the output stage may receive a signal from pulse-width modulator 402 and may generate high-frequency square wave signals.

Transistors in the output stage may rapidly switch between on and off states, regulating the output voltage. This results in minimal power dissipation, enhancing energy efficiency. The amplified signal, reconstructed from the PWM 112, may then be filtered to eliminate high-frequency components, delivering a faithful analog audio output.

The class D amplifier 402 utilises a plurality of nested feedback loops, a first feedback loop 210*a*, second feedback loop 210*b*' and third feedback loop 210*c*.

The first and innermost loop 210*a* has been discussed previously in context of SDM 400.

The second loop 210*b*' is formed by coupling a second overload adder 212*b* to the stabilizer 202 to receive overload signal 207, wherein the overload adder 212*b* also receives an PWM output signal 406 of PWM 112. The second overload adder 212*b* thereby transmits a second combined closed loop signal 210*b*' to a second SDA 102 coupled to a loop filter 104*b*, coupled to the SDB 101, coupled to the stabilizer 202: thereby closing the loop.

The third loop 210*c* is formed by coupling a third overload adder 212*c* to the stabilizer 202 to receive overload signal 207, wherein the overload adder 212*b* is also coupled to an ADC 116 which receives the D output signal 408 of the class D output stage 404. The ADC 116 provides a ADC output signal 410 to the third overload adder 212*c* which transmits a third combined closed loop signal 210*c* to a third SDA 103*c* coupled to a loop filter 104*c*, coupled to a loop filter 104*b*, coupled to the SDB 101, coupled to the stabilizer 202: thereby closing the loop.

The single saturator 206 thereby controls the maximum modulation index, the highest ratio of the peak amplitude, to prevent overload in the class D amplifier 402. Therefore, the saturator stops adjacent PWM 112 pulses colliding, which would impact total harmonic distortion and switching frequency, which may result in contributory effects to electromagnetic interference.

Figure 5:
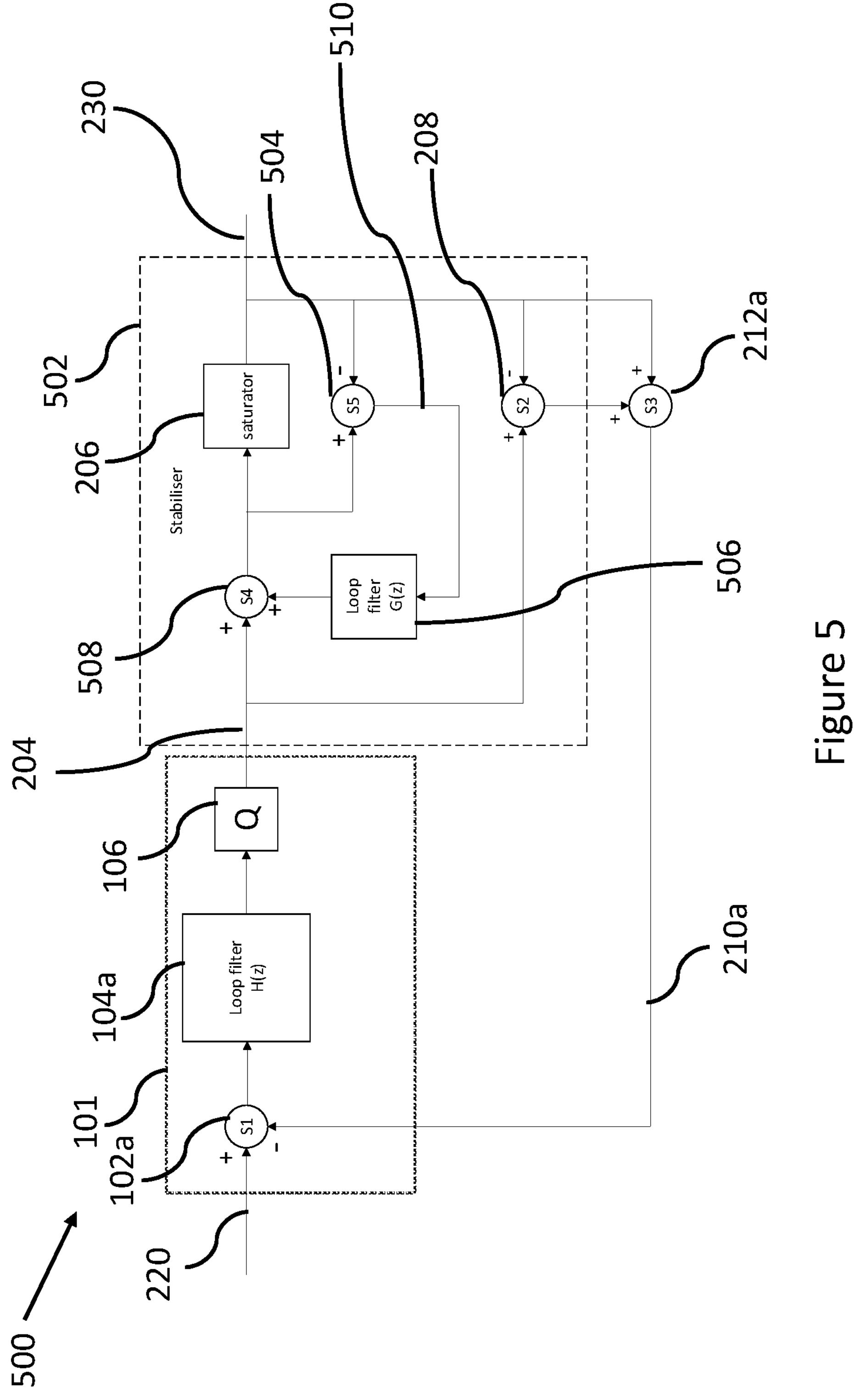
FIG. 5 is a schematic of a class D amplifier in accordance with a fifth embodiment of the present disclosure.

FIG. 5 illustrates a SDM 500 having a SDB 101 and a stabilizer 502 coupled to a first overload adder 212*a* in accordance with a fifth embodiment of the present disclosure.

The stabilizer 502 features an improvement to stabilizer 202 discussed previously whereby a feedback loop 510 is applied around the saturator 202. The feedback loop 510 has a first error adder 504 wherein the error adder 504 is a component that finds the error across the saturator 206 and transmits that error to an error loop filter 506. The loop filter 506 adds the filtered error back as an input to a second error adder 508 which also receives an input signal from the SDB 101, thereby providing the SDB output signal 204 to the saturator 206.

This feedback loop 510 reduces the impact of the saturation on the noise performance of the system, by correcting for errors introduced. In a typical realization, the loop filter 510 has a second-order transfer function which is very efficient to implement in hardware: $G(z)=2z^{-1}-z^{-2}$ where z is complex variable in a discrete time system, the z-transform of the laplace domain.

Class D amplifiers 402 and sigma-delta modulators 200, 201, 400, 500 may be used for enhancing the performance of wireless headphone audio systems. Class D amplifiers 402 of the present disclosure have particularly power high efficiency and are particularly well-suited for portable devices due to their ability to convert digital audio signals into analog with minimal power dissipation. This efficiency is essential in wireless headphones where battery life is a critical consideration. Additionally, the compact design of Class D amplifiers aligns with the space constraints of headphone applications.

Sigma-delta modulators 200, 201 400 contribute to achieving high-resolution audio in wireless headphones. These modulators utilize oversampling and noise-shaping techniques to improve the signal-to-noise ratio, ensuring a cleaner and more accurate audio representation. By employing sigma-delta modulation in the digital-to-analogue conversion process, wireless headphones can deliver a more faithful reproduction of the original audio signal.

Embodiments of the present disclosure can be used to provide a sigma-delta modulator that can maintain stability for high input signal levels, and therefore can provide an improved sigma-delta modulator when compared to known systems. Such a sigma-delta modulator may be used to provide an improved class D amplifier comprising the sigma-delta modulator.

Various improvements and modifications may be made to the above without departing from the scope of the disclosure.

The invention claimed is:

1. A sigma-delta modulator, comprising:

a sigma-delta circuit configured to provide a non-limiting output; and a stabilizer configured to:

receive the non-limiting output of the sigma-delta circuit; and transmit a stabilized loop signal; wherein:

the sigma-delta circuit and stabilizer are arranged as a sigma-delta loop;

the sigma-delta circuit is configured to receive the stabilized loop signal from the stabilizer for stabilizing the sigma-delta circuit;

the stabilizer comprises:

a saturator arranged to restrict the non-limiting output of the sigma-delta circuit to a predetermined limit;

a subtractor configured to extract an overload signal that is determined by a difference in magnitude between the non-limiting output of the sigma-delta circuit and the predetermined limit;

a first overload adder configured to add the overload signal from the subtractor with the predetermined limit to form a combined feedback signal; and the combined feedback signal is the stabilized loop signal transmitted by the stabilizer and received by the sigma-delta circuit.

2. The sigma-delta modulator of claim 1, the sigma-delta circuit comprising:

a quantizer arranged to provide the non-limiting output.

3. The sigma-delta modulator of claim 2, the sigma-delta circuit comprising:

a first loop filter arranged to filter a predetermined range and provide a filtered sigma-delta signal to a non-limiting quantizer.

4. The sigma-delta modulator of claim 1, wherein when output signal falls below the predetermined limit, the overload signal is zero.

5. The sigma-delta modulator of claim 4, wherein the sigma-delta modulator has an external input signal, and the sigma-delta circuit comprises:

a first sigma-delta adder configured to add the combined feedback signal to an external input of the sigma-delta modulator thereby providing a combined input signal for the sigma-delta circuit.

6. The sigma-delta modulator of claim 1, the predetermined limit comprising:

approximately −3 dB.

7. The sigma-delta modulator of claim 6, further comprising:

a plurality of nested feedback loops, wherein each nested feedback loop is configured to receive the overload signal, wherein the overload signal is added into all feedback signals thereby ensuring stability in all loops.

8. The sigma-delta modulator of claim 7 wherein the plurality of nested feedback loops comprises:

a first nested feedback loop comprising the first overload adder and a first sigma-delta adder.

9. The sigma-delta modulator of claim 8 wherein the plurality of nested feedback loops comprises:

a second nested feedback loop comprising: a second overload adder and a second sigma-delta adder.

10. The sigma-delta modulator of claim 9 wherein the plurality of nested feedback loops comprises:

a third nested feedback loop comprising: a third overload adder and a third sigma-delta adder.

11. The sigma-delta modulator of claim 8 wherein the first nested feedback loop is arranged as an innermost of the plurality of nested feedback loops.

12. A class D amplifier comprising;

a sigma-delta modulator, comprising:

a sigma-delta circuit arranged to provide a non-limiting output;

a stabilizer arranged to receive the non-limiting output from the sigma-delta circuit and transmit a stabilised loop signal; wherein:

the sigma-delta circuit and stabilizer are arranged as a sigma-delta loop;

the sigma-delta circuit receives the stabilized loop signal from the stabilizer for stabilizing the sigma-delta circuit;

the stabilizer comprises:

a saturator arranged to restrict the non-limiting output of the sigma-delta circuit to a predetermined limit;

a subtractor configured to extract an overload signal that is determined by a difference in magnitude between an output signal of the sigma-delta circuit over the predetermined limit;

a first overload adder configured to add the overload signal from the subtractor with the predetermine limit to form a combined feedback signal; and the combined feedback signal is the stabilized loop signal transmitted by the stabilizer and received by the sigma-delta circuit.

13. The class D amplifier of claim 12, wherein:

the saturator limits the class D amplifier to a predetermined maximum modulation index for preventing overload within the class D amplifier.

14. The class D amplifier of claim 13 is an audio amplifier.

15. The class D amplifier of claim 14 is being implemented in wireless headphone applications.

16. A method of stabilizing a sigma-delta modulator comprising:

providing a non-limiting output using a sigma-delta circuit;

receiving the non-limiting output at a stabilizer;

transmitting a stabilized loop signal from the stabilizer;

receiving the stabilized loop signal at the sigma-delta circuit; and using the stabilized loop signal to stabilize the sigma-delta circuit for stabilizing the sigma-delta modulator, wherein:

the stabilizer comprises:

a saturator arranged to restrict the non-limiting output of the sigma-delta circuit to a predetermined limit;

a subtractor configured to extract an overload signal that is determined by a difference in magnitude between an output signal of the sigma-delta circuit over the predetermined limit;

a first overload adder configured to add the overload signal from the subtractor with the predetermine limit to form a combined feedback signal; and the combined feedback signal is the stabilized loop signal transmitted by the stabilizer and received by the sigma-delta circuit.

17. The method of claim 16, wherein the sigma-delta modulator is part of a class D amplifier.

* * * * *